(12) United States Patent
Sakiyama et al.

(10) Patent No.: US 12,340,992 B2
(45) Date of Patent: Jun. 24, 2025

(54) DETECTION AND LOCATION OF ANOMALOUS PLASMA EVENTS IN FABRICATION CHAMBERS

(71) Applicant: Lam Research Corporation, Fremont, CA (US)

(72) Inventors: Yukinori Sakiyama, West Linn, OR (US); Niraj Rana, West Linn, OR (US); Noah Elliot Baker, West Linn, OR (US)

(73) Assignee: Lam Research Corporation, Fremont, CA (US)

( * ) Notice: Subject to any disclaimer, the term of this patent is extended or adjusted under 35 U.S.C. 154(b) by 377 days.

(21) Appl. No.: 17/756,081

(22) PCT Filed: Nov. 18, 2020

(86) PCT No.: PCT/US2020/061052
§ 371 (c)(1),
(2) Date: May 16, 2022

(87) PCT Pub. No.: WO2021/101993
PCT Pub. Date: May 27, 2021

(65) Prior Publication Data
US 2022/0406578 A1    Dec. 22, 2022

Related U.S. Application Data

(60) Provisional application No. 62/938,454, filed on Nov. 21, 2019.

(51) Int. Cl.
*H01J 37/32* (2006.01)
*C23C 16/50* (2006.01)
(Continued)

(52) U.S. Cl.
CPC ........ *H01J 37/32917* (2013.01); *C23C 16/50* (2013.01); *C23C 16/52* (2013.01);
(Continued)

(58) Field of Classification Search
CPC ............... H01J 37/32917; H01J 37/244; H01J 37/32899; H01J 37/32082;
(Continued)

(56) References Cited

U.S. PATENT DOCUMENTS

| 5,571,366 A | 11/1996 | Ishii et al. |
| 5,717,187 A | 2/1998 | Rogozinski et al. |

(Continued)

FOREIGN PATENT DOCUMENTS

| CN | 102169145 A | 8/2011 |
| CN | 103120032 A | 5/2013 |

(Continued)

OTHER PUBLICATIONS

International Preliminary Report on Patentability dated Aug. 26, 2021 issued in Application No. PCT/US2020/017193.

(Continued)

*Primary Examiner* — Rudy Zervigon
(74) *Attorney, Agent, or Firm* — Weaver Austin Villeneuve & Sampson LLP

(57) ABSTRACT

An apparatus to determine occurrence of an anomalous plasma event occurring at or near a process station of a multi-station integrated circuit fabrication chamber is disclosed. In particular embodiments, optical emissions generated responsive to the anomalous plasma event may be detected by at least one photosensor of a plurality of photosensors. A processor may cooperate with the plurality of photosensors to determine that the anomalous plasma event has occurred at or near by a particular process station of the multi-station integrated circuit fabrication chamber.

25 Claims, 6 Drawing Sheets

(51) Int. Cl.
  *C23C 16/52* (2006.01)
  *G01J 3/02* (2006.01)
  *G01J 3/443* (2006.01)
  *H01J 37/244* (2006.01)
  *H01L 21/67* (2006.01)

(52) U.S. Cl.
  CPC ............ *G01J 3/0248* (2013.01); *G01J 3/443* (2013.01); *H01J 37/244* (2013.01); *H01J 37/32899* (2013.01); *H01L 21/6719* (2013.01); *H01L 21/67288* (2013.01); *H01J 37/32082* (2013.01); *H01J 2237/2445* (2013.01)

(58) Field of Classification Search
  CPC ......... H01J 2237/2445; H01J 37/32935; H01J 37/32972; H01J 37/3299; C23C 16/50; C23C 16/52; C23C 16/54; C23C 16/45551; C23C 16/545; C23C 16/4412; C23C 14/568; C23C 16/4401; G01J 3/0248; G01J 3/443; G01J 1/0266; G01J 1/0466; H01L 21/6719; H01L 21/67288; H01L 21/67196; H01L 21/67201; H01L 21/67173; H01L 21/67184; H01L 21/6776; H01L 21/67161; H01L 21/67155; H01L 21/67017; H01L 21/67069; H01L 21/67748; H01L 21/67751; H01L 21/67745
  USPC ........................ 118/719; 156/345.31, 345.32
  See application file for complete search history.

(56) References Cited

U.S. PATENT DOCUMENTS

| | | | |
|---|---|---|---|
| 6,077,386 A * | 6/2000 | Smith, Jr. | G01J 3/443 118/713 |
| 6,090,302 A * | 7/2000 | Smith, Jr. | G01J 3/443 216/60 |
| 6,123,983 A * | 9/2000 | Smith, Jr. | G01J 3/28 700/121 |
| 6,132,577 A * | 10/2000 | Smith, Jr. | G01J 3/28 134/1.1 |
| 6,134,005 A * | 10/2000 | Smith, Jr. | G01J 3/443 356/369 |
| 6,157,447 A * | 12/2000 | Smith, Jr. | G01J 3/443 356/311 |
| 6,165,312 A * | 12/2000 | Smith, Jr. | G01J 3/28 216/60 |
| 6,169,933 B1 * | 1/2001 | Smith, Jr. | G01J 3/443 700/121 |
| 6,192,826 B1 * | 2/2001 | Smith, Jr. | G01J 3/443 118/723 AN |
| 6,221,679 B1 * | 4/2001 | Smith, Jr. | G01J 3/443 216/60 |
| 6,223,755 B1 * | 5/2001 | Smith, Jr. | G01J 3/28 134/1 |
| 6,246,473 B1 * | 6/2001 | Smith, Jr. | G01J 3/443 216/60 |
| 6,254,717 B1 * | 7/2001 | Smith, Jr. | G01J 3/28 156/345.32 |
| 6,261,470 B1 * | 7/2001 | Smith, Jr. | G01J 3/28 216/60 |
| 6,269,278 B1 * | 7/2001 | Smith, Jr. | G01J 3/28 700/121 |
| 6,275,740 B1 * | 8/2001 | Smith, Jr. | G01J 3/28 700/121 |
| 6,381,022 B1 * | 4/2002 | Zavracky | G01J 3/10 356/519 |
| 6,383,402 B1 * | 5/2002 | Smith, Jr. | G01J 3/443 216/60 |
| 6,419,801 B1 * | 7/2002 | Smith, Jr. | G01J 3/443 216/60 |
| 8,440,061 B2 | 5/2013 | Valcore, Jr. et al. | |
| 8,822,948 B1 | 9/2014 | Hartwell | |
| 9,627,186 B2 | 4/2017 | Valcore, Jr. et al. | |
| 10,121,708 B2 | 11/2018 | Sakiyama et al. | |
| 10,365,212 B2 | 7/2019 | Kueny et al. | |
| 2003/0170984 A1 * | 9/2003 | Yamamoto | H01L 21/67069 438/689 |
| 2003/0176074 A1 * | 9/2003 | Paterson | H01J 37/32458 438/709 |
| 2008/0061793 A1 | 3/2008 | Anwar et al. | |
| 2011/0215072 A1 | 9/2011 | Park et al. | |
| 2011/0265951 A1 * | 11/2011 | Xu | C23C 16/46 118/712 |
| 2012/0034844 A1 * | 2/2012 | Zhang | B24B 37/042 451/6 |
| 2012/0034845 A1 * | 2/2012 | Hu | B24B 37/205 451/6 |
| 2012/0037188 A1 | 2/2012 | McCormick et al. | |
| 2012/0096006 A1 * | 4/2012 | David | H01L 22/12 707/E17.049 |
| 2012/0268738 A1 * | 10/2012 | David | B24B 37/013 356/326 |
| 2013/0103347 A1 | 4/2013 | Jun et al. | |
| 2015/0241272 A1 | 8/2015 | Lian et al. | |
| 2016/0064199 A1 | 3/2016 | Valcore, Jr. et al. | |
| 2016/0379896 A1 * | 12/2016 | Asakura | H01J 37/32972 156/345.24 |
| 2017/0141001 A1 | 5/2017 | Sakiyama et al. | |
| 2017/0200658 A1 | 7/2017 | Yang et al. | |
| 2018/0038800 A1 * | 2/2018 | Gamache | G01N 21/67 |
| 2018/0136118 A1 | 5/2018 | Kueny et al. | |
| 2018/0252650 A1 * | 9/2018 | Morvay | H01J 37/32422 |
| 2018/0269119 A1 | 9/2018 | Coppa et al. | |
| 2018/0286650 A1 * | 10/2018 | Bullock | G01N 21/71 |
| 2020/0373210 A1 * | 11/2020 | Chen | G01J 3/0208 |
| 2022/0037135 A1 | 2/2022 | Kapoor et al. | |
| 2024/0355600 A1 | 10/2024 | Kapoor et al. | |

FOREIGN PATENT DOCUMENTS

| | | |
|---|---|---|
| CN | 105389289 A | 3/2016 |
| CN | 105474378 A | 4/2016 |
| EP | 1191569 A2 | 3/2002 |
| JP | H11288921 A | 10/1999 |
| JP | 2003173973 A | 6/2003 |
| KR | 20080006750 A | 1/2008 |
| KR | 20120127349 A | 11/2012 |
| TW | 201536116 A | 9/2015 |
| WO | WO-2012039867 A1 | 3/2012 |

OTHER PUBLICATIONS

International Preliminary Report on Patentability dated Jun. 2, 2022, in PCT Application No. PCT/US2020/061052.
International Search Report and Written Opinion dated Mar. 11, 2021 issued in Application No. PCT/US2020/061052.
International Search Report and Written Opinion dated Sep. 16, 2020 issued in Application No. PCT/US2020/017193.
CN Office Action dated Mar. 5, 2024 in CN Application No. 202080028432.7, with English Translation.
CN Office Action dated Sep. 28, 2023, in Application No. CN202080028432.7 with English translation.
JP Office Action dated Jul. 30, 2024 in JP Application No. 2021-547159, with English Translation.
JP Office Action dated Mar. 19, 2024 in JP Application No. 2021-547159 with English translation.
JP Office Action dated Nov. 21, 2023 in JP Application No. JP2021-547159 with English translation.
KR Office Action dated Sep. 28, 2024 in KR Application No. 10-2021-7029310 with English Translation.
SG Written Opinion dated Apr. 21, 2023 in Application No. SG11202108726S.
SG Written Opinion dated Apr. 23, 2024 in SG Application No. 11202108726S.
TW Office Action dated Jan. 10, 2024 in TW Application No. 109104147, with English Translation.

(56) References Cited

OTHER PUBLICATIONS

U.S. Non-Final Office Action dated Nov. 16, 2023 in U.S. Appl. No. 17/310,574.
U.S. Notice of Allowance dated Apr. 8, 2024 in U.S. Appl. No. 17/310,574.
U.S. Appl. No. 18/761,206, inventors Kapoor S, et al., filed Jul. 1, 2024.
CN Office Action dated Feb. 27, 2025 in CN Application No. 202080080541.3, with English Translation.

\* cited by examiner

202

| Station Undergoing Anonymous Plasma Event | Photosensor Logic State | | | |
|---|---|---|---|---|
| | 205 | 210 | 215 | 220 |
| 151 | High | Low | High | Low |
| 152 | High | Low | Low | High |
| 153 | Low | High | Low | High |
| 154 | Low | High | High | Low |

401

| Station Undergoing UPE | Photosensor Logic State | | |
|---|---|---|---|
| | 605 | 610 | 615 |
| 651 | Low | High | Low |
| 652 | High | Low | Low |
| 653 | High | High | Low |
| 654 | High | Low | High |

510
Receive output signals from a plurality of photosensors, at least one photosensor of the plurality of photosensors having a field of view of two or more stations of a multi-station integrated circuit fabrication chamber 520
Filter the received output signals to screen output signals having less than a threshold amplitude 530
Comparing logic states corresponding to the filtered received output signals to identify the station of the multi-station integrated circuit fabrication chamber at which an anomalous plasma event has occurred

*FIG. 5*

DETECTION AND LOCATION OF ANOMALOUS PLASMA EVENTS IN FABRICATION CHAMBERS

INCORPORATION BY REFERENCE

A PCT Request Form is filed concurrently with this specification as part of the present application. Each application that the present application claims benefit of or priority to as identified in the concurrently filed PCT Request Form is incorporated by reference herein in their entireties and for all purposes.

BACKGROUND

During wafer fabrication processes, such as deposition or etching of a film on a substrate utilizing a multi-station integrated circuit fabrication chamber, an anomalous plasma event may occur. Such events may bring about damage to a wafer and/or to the integrated circuit fabrication chamber itself. Thus, approaches toward detection and location of anomalous plasma events occurring within an integrated circuit fabrication chamber continues to be an active area of investigation.

The background description provided herein is for the purposes of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

SUMMARY

Briefly, particular embodiments may be directed to a fabrication chamber, including a plurality of stations. The fabrication chamber also includes a plurality of viewports at least partially transparent to optical emissions that emanate from at least one station of the plurality of stations. The fabrication chamber also includes a plurality of photosensors. Each sensor of the plurality of photosensors is arranged proximate to a corresponding one of the plurality of viewports, to detect the optical emissions that emanate from the at least one station of the plurality of stations. The fabrication chamber also includes a processor configured to identify the at least one station of the plurality of stations at which an anomalous plasma event has occurred based, at least in part, on output signals from at least two photosensors of the plurality of photosensors.

In certain embodiments, the viewports of the fabrication chamber arranged in adjacent sidewalls of the fabrication chamber to permit transmission of the optical emissions from each of the plurality of stations. In certain embodiments, fabrication chamber includes 4 stations. The one or more viewports of the plurality of viewports permit observation of two or more adjacent, but not all, stations. In certain embodiments, the processor identifies the at least one station of the plurality of stations at which the anomalous plasma event has occurred responsive to evaluation of the output signals from the plurality of photosensors. A first viewport of the plurality of viewports permits visibility into first and second stations of the plurality of stations, and a second viewport of the plurality of viewports permits visibility into third and fourth stations of the plurality of stations. A third viewport of the plurality of viewports permits visibility into the first and the third stations of the plurality of stations, and a fourth viewport of the plurality of viewports permits visibility into the second and the fourth stations of the plurality of stations. In certain embodiments, the viewports of the fabrication chamber are at least partially transparent to optical emissions with wavelengths of between about 300 nm and about 700 nm. In certain embodiments, the fabrication chamber includes a processor configured to identify the at least one station at which the anomalous plasma event has occurred based, at least in part, on the anomalous plasma event that occurs over a duration of between about 1 µs and about 100 ms. In certain embodiments, the anomalous plasma event includes a transient generation of an electrical discharge between two or more localized regions within one of the plurality of stations. In certain embodiments, the processor is configured to identify the at least one station at which the anomalous plasma event has occurred based, at least in part, on the optical emissions that reach a threshold amplitude in less than about 100 ms. In certain embodiments, the processor generates a signal to indicate that a semiconductor wafer at the at least one station of the plurality of stations is proximate to a location at which the anomalous plasma event has occurred. In certain embodiments, the fabrication chamber is configured to perform a plasma-based etching process or a plasma-based deposition process.

In particular embodiments, an apparatus for detecting and reporting an anomalous plasma event may include first and second photosensors. Each of the first and second photosensors being arranged at a corresponding viewport of a multi-station integrated circuit fabrication chamber. Each of the first and second photosensors is configured to detect an optical signal with a minimum threshold amplitude within about 1 us and about 100 ms. The apparatus also includes a processor configured to identify a station of the multi-station integrated circuit fabrication chamber which has undergone an anomalous plasma event based, at least in part, on output signal levels of each of the first and second photosensors.

In particular embodiments, a method, includes receiving output signals from a plurality of photosensors, at least one photosensor of the plurality of photosensors having a field of view of two or more stations of a multi-station integrated circuit fabrication chamber. The method also includes filtering the received output signals to screen output signals having less than a threshold amplitude. The method also includes comparing logic states corresponding to the filtered received output signals to identify the station of the multi-station integrated circuit fabrication chamber at which an anomalous plasma event has occurred.

In certain embodiments, the method includes use of a photosensor in which the field of view of a first photosensor of the plurality of photosensors overlaps with the field of view of at least a second photosensor of the plurality of photosensors. In certain embodiments, the method additionally includes filtering the output signals to screen signals having a duration that is less than a threshold. In certain embodiments the method additionally includes screening signals of a duration of less than about 1 µs. In certain embodiments, the method additionally includes filtering the output signals to screen signals of a duration that exceeds a threshold value. In certain embodiments, the method additionally includes filtering includes screening signals of a duration of greater than about 100 ms. In certain embodiments, the method further includes indicating that a measurement process is to be conducted on a semiconductor wafer responsive to detection of the anomalous plasma event at a location proximate to the semiconductor wafer.

In particular embodiments an integrated circuit fabrication chamber, includes a plurality of integrated circuit fabrication stations. The integrated circuit fabrication chamber also includes one or more input ports for coupling a radio frequency (RF) signal to at least one of the plurality of integrated circuit fabrication stations. The integrated circuit fabrication chamber also includes a plurality of viewports at least partially transparent to optical emissions that emanate from at least one of the plurality of integrated circuit fabrication stations. The integrated circuit fabrication chamber also includes at least first and second photosensors. Each of the at least first and second photosensors are arranged proximate to a corresponding one of the plurality of viewports, to detect the optical emissions that emanate from the at least one of the plurality of integrated circuit fabrication stations.

In certain embodiments, the integrated circuit fabrication chamber the plurality of viewports are at least partially transparent to the optical emissions with a wavelength of about 300 nm to about 700 nm. In certain embodiments, optical emissions generated at a station of the integrated circuit fabrication chamber are generated responsive to the RF signal coupled to the at least one of the plurality of integrated circuit fabrication stations. In certain embodiments, the plurality of integrated circuit fabrication stations includes 4 stations. In certain embodiments, the at least first and second photosensors provide an output signal in response to detection of the optical emissions with a duration of at least 1 µs. In certain embodiments, the at least first and second photosensors provide output signals to a processor to identify a station of the plurality integrated circuit fabrication stations at which an anomalous plasma event has occurred. In certain embodiments, the processor is to identify the station of the plurality of integrated circuit fabrication stations based, at least in part, on output signals from the first and second photosensors of the at least first and second photosensors.

BRIEF DESCRIPTION OF THE DRAWINGS

The various implementations disclosed herein are illustrated by way of example, and not by way of limitation, in the figures of the accompanying drawings, in which like reference numerals refer to similar elements.

FIG. 4B is an example showing logic states corresponding to output signals of photosensors implemented in the example anomalous plasma event detection and location system of FIG. 4A, according to another embodiment.

FIG. 5 is a flowchart for an example method of anomalous plasma event detection and location implemented on a multi-station integrated circuit fabrication chamber, according to various embodiments.

DETAILED DESCRIPTION

Figure 1A:
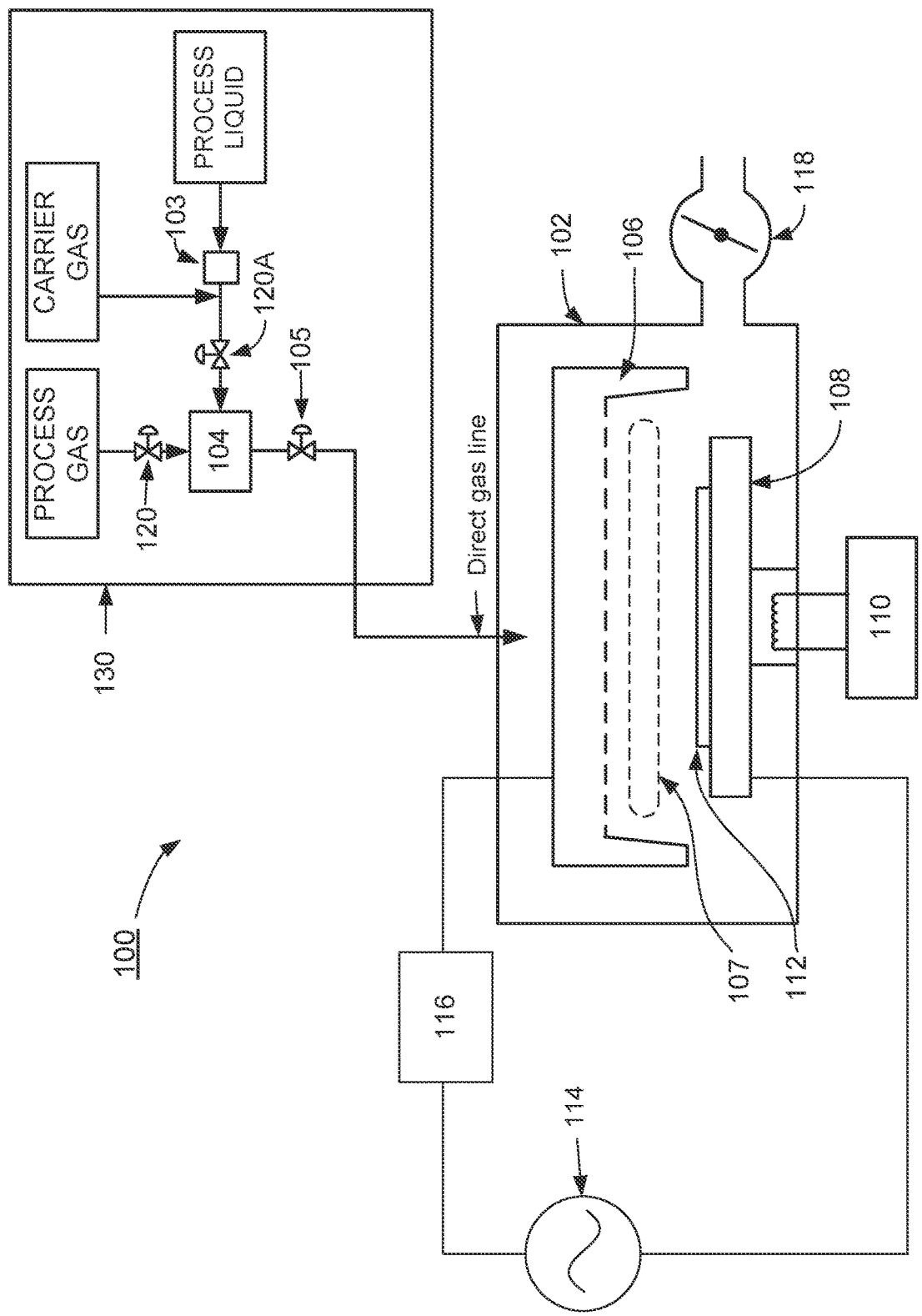
FIG. 1A shows an example apparatus for depositing or etching a film on or over a substrate utilizing any number of processes, according to various embodiments.

In certain types of integrated circuit fabrication chambers, a radio frequency (RF) power source may be utilized to provide a signal that gives rise to formation of a plasma within the fabrication chamber. The plasma may include ionized gaseous compounds. In a multi-station integrated circuit fabrication chamber, a RF power source may be utilized to provide a signal that gives rise to a plasma at the stations of the multi-station integrated circuit fabrication chamber. Following ionization, gaseous compounds in the fabrication chamber may react with one another during an integrated circuit deposition process, for example, or during an integrated circuit etching process. In a multi-station integrated circuit fabrication chamber, in which multiple semiconductor wafers simultaneously undergo deposition or etching processes, a single RF input signal may provide RF power to each station of the multi-station fabrication chamber. In some instances, amplitude of a signal from an RF power source may be controlled. Amplitude of a RF signal may be controlled to provide sufficient energy to form a plasma within a fabrication chamber but without bringing about anomalous conditions within the fabrication chamber. Anomalous conditions may include, for example, formation of an electrical arc, or other type of visible event generated by an electrical discharge between or among two or more localized regions within a process station. Anomalous conditions may bring about excessive heating and excessive electrical current. Anomalous conditions may include instabilities in a plasma due to particles present in a fabrication chamber anomalous conditions may also include abrupt changes in gas pressure and/or gas composition, and failures of RF power generating circuitry.

In particular instances, in response to an anomalous plasma event in a multi-station integrated circuit fabrication chamber, such as formation of an electrical arc, localized regions of one or more integrated circuit wafers undergoing fabrication may be exposed to elevated temperatures. An anomalous plasma events may expose integrated circuit wafers undergoing fabrication to an electrical current sufficient to bring about damage to the circuit wafers. In such instances, it may be necessary to remove the potentially damaged integrated circuit wafer from the fabrication chamber so that the wafer may undergo a metrology process. A metrology process may include performing electrical measurements, physical inspections, and/or other processes. In some instances, formation of an electrical arc may give rise to significant damage, which may result in scrapping or discarding one or more potentially damaged integrated circuit wafers. Additionally, in some instances, formation of an electrical arc may bring about damage to the integrated circuit fabrication chamber itself, which may necessitate costly repair as well as the temporary decommissioning of the fabrication chamber.

For the above-identified reasons, and potentially others, it may be advantageous to quickly detect that an anomalous plasma event has occurred within a multi-station integrated circuit fabrication chamber. Anomalous plasma events, such as formation of an electrical arc, may expose integrated circuit wafers and/or interior portions of a multi-station integrated circuit fabrication chamber to elevated temperatures and to increased electrical currents. However, responsive to timely detection of an anomalous plasma event in a fabrication chamber, a power source, such as a RF power source, may be interrupted, reduced in amplitude, or adjusted in some other manner Interruption, reduction in amplitude, or other type of adjustment of a RF power source may minimize, or in some cases avoid entirely, damage to an integrated circuit wafer and/or the integrated circuit fabrication chamber itself. In addition, by detecting the location (or station) at which an anomalous plasma event has occurred, a separate metrology process may be performed on a single wafer. Performing a metrology process on a single wafer may be advantageous when compared with performing a metrology process on all wafers present within the multi-station fabrication chamber. Detection and location of anomalous plasma events in an integrated circuit fabrication chamber may be advantageous for additional reasons, and claimed subject matter is not limited in this respect.

Certain embodiments and implementations may be utilized in conjunction with a number of wafer fabrication processes, such as various plasma-enhanced atomic layer deposition (PEALD) processes (e.g., PEALD1, PEALD2), various plasma-enhanced chemical vapor deposition (e.g., PECVD1, PECVD2, PECVD3) processes, or may be utilized on-the-fly during single deposition processes. In certain implementations, a RF power generator having multiple output ports may be utilized at any signal frequency, such as at frequencies between 300 kHz and 60 MHz, which may include frequencies of 400 kHz, 1 MHz, 2 MHz, 13.56 MHz, and 27.12 MHz. However, in other implementations, RF power generators having multiple output ports may operate at any signal frequency, which may include relatively low frequencies, such as between 50 kHz and 300 kHz, as well as higher frequencies, such as frequencies of between about 60 MHz and about 100 MHz, virtually without limitation.

It should be noted that although particular embodiments described herein may show and/or describe multi-station semiconductor fabrication chambers comprising 4 process stations. However, claimed subject matter is intended to embrace multi-station integrated circuit fabrication chambers comprising any number of process stations. Thus, in certain implementations, an output signal of a RF power generator may be divided among, 2 process stations or 3 process stations of a multi-station integrated circuit fabrication chamber. An output power signal from a RF power generator may be divided among a larger number of process stations virtually without limitation, such as 5 process stations, 6 process stations, 8 process stations, 10 process stations. An output power signal from a RF power generator may be divided among any other number of process stations of a multi-station integrated circuit fabrication chamber. Particular embodiments described herein may show and/or describe utilization of a single, relatively low frequency RF signal, such as a frequency of between about 300 kHz and about 2 MHz, as well as a single, relatively high-frequency RF signal, such as a frequency of between 2 MHz and 100 MHz. Claimed subject matter is intended to embrace the use of any number of radio frequencies, such as frequencies below 2 MHz, as well as any number of radio frequencies above 2 MHz.

Manufacture of semiconductor devices may involve depositing or etching of one or more thin films on or over a planar or non-planar substrate in an integrated fabrication process. In some aspects of an integrated circuit fabrication process, it may be useful to deposit thin films that conform to unique substrate topography. One type of reaction that is useful in many instances may involve chemical vapor deposition (CVD). In certain CVD processes, gas phase reactants introduced into stations of a reaction chamber simultaneously undergo a gas-phase reaction. The products of the gas-phase reaction deposit on the surface of the substrate. A reaction of this type may be driven by, or enhanced by, presence of a plasma, in which case the process may be referred to as a plasma-enhanced chemical vapor deposition (PECVD) reaction. As used herein, the term CVD is intended to include PECVD unless otherwise indicated. CVD processes have certain disadvantages that render them less appropriate in some contexts. For instance, mass transport limitations of CVD gas phase reactions may bring about deposition effects that exhibit thicker deposition at top surfaces (e.g., top surfaces of gate stacks) and thinner deposition at recessed surfaces (e.g., bottom corners of gate stacks). Further, in response to some semiconductor die having regions of differing device density, mass transport effects across the substrate surface may result in within-die and within-wafer thickness variations. Thus, during subsequent etching processes, thickness variations can result in over-etching of some regions and under-etching of other regions, which can degrade device performance and die yield. Another difficulty related to CVD processes is that such processes are often unable to deposit conformal films in high aspect ratio features. This issue can be increasingly problematic as device dimensions continue to shrink. These and other drawbacks of particular aspects of wafer fabrication processes are discussed in relation to FIG. 1A and FIG. 1B.

In another example, some deposition processes involve multiple film deposition cycles, each producing a discrete film thickness. For example, in atomic layer deposition (ALD), thickness of a deposited layer may be limited by an amount of one or more film precursor reactants, which may adsorb onto a substrate surface, so as to form an adsorption-limited layer, prior to the film-forming chemical reaction itself. Thus, a feature of ALD involves the formation of thin layers of film, such as layers having a width of a single atom or molecule, which are used in a repeating and sequential matter. As device and feature sizes continue to be reduced in scale, and as three-dimensional devices and structures become more prevalent in integrated circuit (IC) design, the capability of depositing thin conformal films (e.g., films of material having a uniform thickness relative to the shape of the underlying structure) continues to gain in importance. Thus, in view of ALD being a film-forming technique in which each deposition cycle operates to deposit a single atomic or molecular layer of material, ALD may be well-suited to the deposition of conformal films. In some instances, device fabrication processes involving ALD may include multiple ALD cycles, which may number into the hundreds or thousands, may then be utilized to form films of virtually any desired thickness. Further, in view of each layer being thin and conformal, a film that results from such a process may conform to a shape of any underlying device structure. In certain implementations, an ALD cycle may include the following steps:

Exposure of the substrate surface to a first precursor.

Purge of the reaction chamber in which the substrate is located.

Activation of a reaction of the substrate surface, such as utilizing a plasma and/or a second precursor.

Purge of the reaction chamber in which the substrate is located.

The duration of each ALD cycle may, at least in particular embodiments, be less than about 25 seconds or less than about 10 seconds or less than about 5 seconds. The plasma exposure step (or steps) of the ALD cycle may be of a short duration, such as a duration of about 1 second or less.

Turning now to the figures, FIG. 1A shows an example apparatus for depositing or etching a film on or over a substrate utilizing any number of processes, according to various embodiments. Processing apparatus 100 of FIG. 1A depicts single process station 102 of a process chamber with a single substrate holder 108 (e.g., a pedestal) in an interior volume, which may be maintained under vacuum by vacuum pump 118. Showerhead 106 and gas delivery system 130, which may be fluidically coupled to the process chamber, may permit the delivery of film precursors, for example, as well as carrier and/or purge and/or process gases, secondary reactants, etc. Equipment utilized in the generation of plasma within the process chamber is also shown in FIG. 1A. The apparatus schematically illustrated in FIG. 1A may be adapted for performing, in particular, plasma-enhanced CVD.

In FIG. 1A, gas delivery system 130 includes a mixing vessel 104 for blending and/or conditioning process gases for delivery to showerhead 106. One or more mixing vessel inlet valves 120 may control introduction of process gases to mixing vessel 104. Particular reactants may be stored in liquid form prior to vaporization and subsequent delivery to process station 102 of a process chamber. The embodiment of FIG. 1A includes a vaporization point 103 for vaporizing liquid reactant to be supplied to mixing vessel 104. In some implementations, vaporization point 103 may include a heated liquid injection module. In some other implementations, vaporization point 103 may include a heated vaporizer. In yet other implementations, vaporization point 103 may be eliminated from the process station. In some implementations, a liquid flow controller (LFC) upstream of vaporization point 103 may be provided for controlling a mass flow of liquid for vaporization and delivery to process station 102.

Showerhead 106 may operate to distribute process gases and/or reactants (e.g., film precursors) toward substrate 112 at the process station, the flow of which may be controlled by one or more valves upstream from the showerhead (e.g., valves 120, 120A, 105). In the embodiment depicted in FIG. 1A, substrate 112 is depicted as located beneath showerhead 106, and is shown resting on a pedestal 108. Showerhead 106 may be of any suitable shape, and may include any suitable number and arrangement of ports for distributing process gases to substrate 112. In some implementations involving 2 or more stations, gas delivery system 130 includes valves or other flow control structures upstream from the showerhead, which can independently control the flow of process gases and/or reactants to each station so as to permit gas flow to one station while prohibiting gas flow to a second station. Furthermore, gas delivery system 130 may be configured to independently control process gases and/or reactants delivered to each station in a multi-station apparatus such that the gas composition provided to different stations is different; e.g., the partial pressure of a gas component may vary between stations at the same time.

In FIG. 1A, volume 107 is depicted as being located beneath showerhead 106. In some implementations, pedestal 108 may be raised or lowered to expose substrate 112 to volume 107 and/or to vary the size of volume 107. Optionally, pedestal 108 may be lowered and/or raised during portions of the deposition process to modulate process pressure, reactant concentration, etc., within volume 107. Showerhead 106 and pedestal 108 are depicted as being electrically coupled to RF power generator 114 and matching network 116 for powering a plasma generator. Thus, showerhead 106 may function as an electrode for coupling RF power into process station 102. In some implementations, the plasma energy is controlled (e.g., via a system controller having appropriate machine-readable instructions and/or control logic) by controlling one or more of a process station pressure, a gas concentration, a RF power generator, and so forth. For example, RF power generator 114 and matching network 116 may be operated at any suitable RF power level, which may operate to form plasma having a desired composition of radical species. In addition, RF power generator 114 may provide RF power having more than one frequency component, such as a low-frequency component (e.g., less than 2 MHz) as well as a high frequency component (e.g., greater than 2 MHz).

In some implementations, plasma generation and maintenance conditions are controlled via appropriate hardware and/or appropriate machine-readable instructions in a system controller. Machine-readable instructions may include a sequence of input/output control (IOC) instructions. In one example, the instructions for generating or maintaining a plasma are provided in the form of a plasma activation recipe of a process recipe. In some cases, process recipes may be sequentially arranged, so that at least some instructions for the process can be executed concurrently. In some implementations, instructions for setting one or more plasma parameters may be included in a recipe preceding a plasma generation process. For example, a first recipe may include instructions for setting a flow rate of an inert (e.g., helium) and/or a reactant gas, instructions for setting a plasma generator to a power set point and time delay instructions for the first recipe. A second, subsequent recipe may include instructions for enabling the plasma generator and time delay instructions for the second recipe. A third recipe may include instructions for disabling the plasma generator and time delay instructions for the third recipe. It will be appreciated that these recipes may be further subdivided and/or iterated in any suitable way within the scope of the present disclosure. In some deposition processes, a duration of a plasma strike may correspond to a duration of a few seconds, such as from about 3 seconds to about 15 seconds, or may involve longer durations, such as durations of up to about 30 seconds, for example. In certain implementations described herein, much shorter plasma strikes may be applied during a processing cycle. Such plasma strike durations may be on the order of less than about 50 milliseconds, with about 25 milliseconds being utilized in a specific example.

Figure 1B:
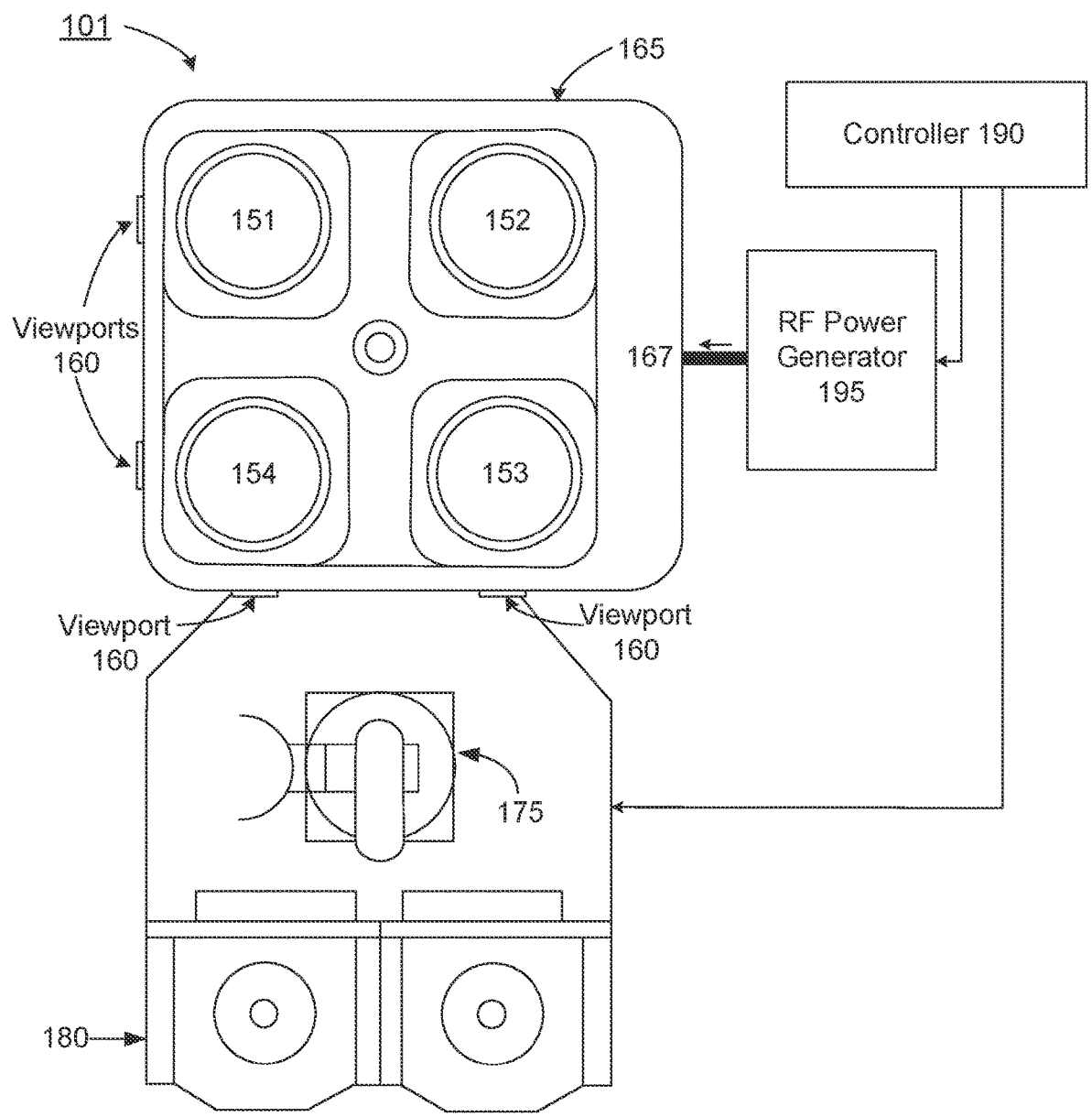
FIG. 1B is a schematic view of an example multi-station integrated circuit fabrication chamber, according to various embodiments.

For simplicity, processing apparatus 100 is depicted in FIG. 1A as a standalone station (102) of a process chamber for maintaining a low-pressure environment. However, it may be appreciated that a plurality of process stations may be included in a multi-station processing tool environment, such as shown in FIG. 1B, which depicts a schematic view of an example multi-station processing tool, according to various embodiments. Processing tool 101 employs an integrated circuit fabrication chamber 165 that includes multiple fabrication process stations. Each fabrication process station may be utilized to perform processing operations on a substrate retained via a wafer holder, such as pedestal 108 of FIG. 1A, at a particular process station. In the example of FIG. 1B, integrated circuit fabrication chamber 165 is shown as comprising 4 process stations 151, 152, 153, and 154. Other similar multi-station processing apparatuses may include more or fewer process stations depending on the implementation and, for instance, the desired level of parallel wafer processing, size/space constraints, cost constraints, etc. Also shown in FIG. 1B is substrate handler robot 175, which may operate under the control of system controller 190, configured to move substrates from a wafer cassette (not shown in FIG. 1B). Substrates from a wafer cassette may be moved from loading port 180 and into multi-station integrated circuit fabrication chamber 165, and onto one of process stations 151, 152, 153, and 154.

FIG. 1B also depicts an embodiment of a system controller 190 employed to control process conditions and hardware states of processing tool 101. System controller 190 may include one or more memory devices, one or more mass storage devices, and one or more processors. The one or more processors may include a central processing unit, analog and/or digital input/output connections, stepper motor controller boards, etc. In some implementations, system controller 190 controls all of the activities of process tool 101. System controller 190 executes system control software stored in a mass storage device, which may be loaded into a memory device, and executed by a processor of the system controller. Software to be executed by a processor of system controller 190 may include instructions for controlling the timing, mixture of gases, fabrication chamber and/or station pressure, fabrication chamber and/or station temperature, wafer temperature, substrate pedestal, chuck and/or susceptor position, number of cycles performed on one or more substrates, and other parameters of a particular process performed by process tool 101. These programed processes may include various types of processes including, but not limited to, processes related to determining an amount of accumulation on a surface of the chamber interior, processes related to deposition of film on substrates including numbers of cycles, determining and obtaining a number of compensated cycles, and processes related to cleaning the chamber. System control software, which may be executed by one or more processors of system controller 190, may be configured in any suitable way. For example, various process tool component subroutines or control objects may be written to control operation of the process tool components necessary to carry out various tool processes.

In some embodiments, software for execution by way of a processor of system controller 190 may include input/output control (IOC) sequencing instructions for controlling the various parameters described above. For example, each phase of deposition and deposition cycling of a substrate may include one or more instructions for execution by system controller 190. The instructions for setting process conditions for an ALD conformal film deposition process phase may be included in a corresponding ALD conformal film deposition recipe phase. In some implementations, the recipe phases may be sequentially arranged, so that all instructions for a process phase are executed concurrently with that process phase.

Other computer software and/or programs stored on a mass storage device of system controller 190 and/or a memory device accessible to system controller 190 may be employed in some embodiments. Examples of programs or sections of programs for this purpose include a substrate positioning program, a process gas control program, a pressure control program, a heater control program, and a plasma control program. A substrate positioning program may include program code for process tool components that are used to load the substrate onto pedestal 108 (of FIG. 1A) and to control the spacing between the substrate and other parts of process tool 101. A positioning program may include instructions for appropriately moving substrates in and out of the reaction chamber as necessary to deposit films on substrates and clean the chamber.

A process gas control program may include code for controlling gas composition and flow rates and for controlling the flow of gas into one or more process stations prior to deposition, which may bring about stabilization of the pressure in the process station. In some embodiments, the process gas control program includes instructions for introducing gases during formation of a film on a substrate in the reaction chamber. This may include introducing gases for a different number of cycles for one or more substrates within a batch of substrates. A pressure control program may include code for controlling the pressure in the process station by regulating, for example, a throttle valve in an exhaust system of the process station, a gas flow into the process station, etc. The pressure control program may include instructions for maintaining the same pressure during the deposition of differing number of cycles on one or more substrates during the processing of the batch.

A heater control program may include code for controlling the current to heating unit 110 that is used to heat the substrate. Alternatively, the heater control program may control delivery of a heat transfer gas (such as helium) to the substrate.

In some embodiments, there may be a user interface associated with system controller 190. The user interface may include a display screen, graphical software displays of the processing tool and/or process conditions, and user input devices such as pointing devices, keyboards, touch screens, microphones, etc.

In some embodiments, parameters adjusted by system controller 190 may relate to process conditions. Non-limiting examples may include process gas composition and flow rates, temperature, pressure, plasma conditions, etc. These parameters may be provided to the user in the form of a recipe, which may be entered utilizing the user interface. The recipe for an entire batch of substrates may include compensated cycle counts for one or more substrates within the batch in order to account for thickness trending over the course of processing the batch.

Signals for monitoring a fabrication process may be provided by analog and/or digital input connections of system controller 190 from various process tool sensors. Signals for controlling the process may be transmitted by way of the analog and/or digital output connections of process tool 101. Non-limiting examples of process tool sensors that may be monitored include mass flow controllers, pressure sensors (such as manometers), thermocouples, etc. Sensors may also be included and used to monitor and determine the accumulation on one or more surfaces of the interior of the chamber and/or the thickness of a material layer on a substrate in the chamber. Appropriately programmed feedback and control algorithms may be used with data from these sensors to maintain process conditions.

System controller 190 may provide program instructions for implementing the above-described deposition processes. The program instructions may control a variety of process parameters, such as DC power level, pressure, temperature, number of cycles for a substrate, amount of accumulation on at least one surface of the chamber interior, etc. The instructions may control the parameters to operate in-situ deposition of film stacks according to various embodiments described herein.

For example, the system controller may include control logic for performing the techniques described herein, such as determining (a) an amount of accumulated deposition material currently on at least an interior region of the deposition chamber interior. In addition, the system controller may include control logic for applying the amount of accumulated deposition material determined in (a), or a parameter derived therefrom, to a relationship between (i) a number of ALD cycles required to achieve a target deposition thickness, and (ii) a variable representing an amount of accumulated deposition material, in order to obtain a compensated number of ALD cycles for producing the target deposition thickness given the amount of accumulated deposition material currently on the interior region of the deposition chamber interior. The system controller may include control logic for performing the compensated number of ALD cycles on one or more substrates in the batch of substrates. The system may also include control logic for determining that the accumulation in the chamber has reached an accumulation limit and stopping the processing of the batch of substrates in response to that determination, and for initiating a cleaning operation of the chamber interior.

In addition to the above-identified functions and/or operations performed by system controller 190 of FIG. 1B, the system controller may additionally control and/or manage the operations of RF power generator 195, which may convey RF power to multi-station integrated circuit fabrication chamber 165 via RF power input port 167. As described further herein, such operations may relate to determining upper and lower thresholds for RF power to be delivered to integrated circuit fabrication chamber 165, RF power activation/deactivation times, RF power on/off duration, duty cycle, operating frequencies, and so forth. Additionally, system controller 190 may determine a set of normal operating parameters of RF power to be delivered to integrated circuit fabrication chamber 165 by way of RF power input port 167. Such parameters may include upper and lower thresholds of, for example, power reflected from RF power input port 167 in terms of a reflection coefficient (e.g., the scattering parameter $S_{11}$), voltage standing wave ratio. Such parameters may also include upper and lower thresholds of a voltage applied to RF power input port 167, upper and lower thresholds of current conducted through RF power input port 167, as well as an upper threshold for a magnitude of a phase angle between a voltage and a current conducted through RF power input port 167. Such thresholds may be utilized in defining "out-of-range" RF signal characteristics. For example, reflected power greater than an upper threshold may indicate an out-of-range RF power parameter. Likewise, an applied voltage or conducted current having a value below a lower threshold or greater than an upper threshold may indicate out-of-range RF signal characteristics. Similarly, a phase angle between an applied voltage and conducted current being greater than an upper threshold may indicate an out-of-range RF power parameter.

In certain implementations, RF power generator 195 may operate to generate 2 frequencies, such as a first frequency of about 400 kHz, and a second frequency, such as a frequency of about 27.12 MHz. It should be noted, however, that RF power generator may be capable of generating other frequencies, such as frequencies of between about 300 kHz and about 100 MHz, and claimed subject matter is not limited in this respect. In particular embodiments, signals generated by RF power generator 195 may include at least one low frequency (LF), which may be defined as a frequency of between about 300 kHz and about 2 MHz, and at least one high frequency (HF), which may be defined as a frequency greater than about 2 MHz but less than about 100 MHz.

In particular embodiments, multi-station integrated circuit fabrication chamber 165 may include input ports in addition to input port 167 (additional input ports not shown in FIG. 1B). In particular embodiments, process stations of integrated circuit fabrication chamber 165 may utilize first and second input ports in which a first input port may convey a signal having a first frequency and in which a second input port may convey a signal having a second frequency. Use of 2 or more frequencies may bring about enhanced plasma characteristics, which may give rise to deposition rates or etching rates within particular limits and/or more easily controlled deposition/etching rates. Use of 2 or more frequencies may bring about other desirable consequences, and claimed subject matter is not limited in this respect.

Multi-station integrated circuit fabrication chamber 165 may further include viewports 160, which may permit observation of a substrate or wafer currently undergoing a fabrication process within chamber 165. In some instances, such viewports may permit an operator of processing tool 101 to determine if an anomalous plasma event is occurring within fabrication chamber 165. In some instances, an anomalous plasma event may be indicated by a momentary burst of optical emissions, such as a flash or momentary burst of visible light having a duration of between about 1 us and about 100 ms. As previously mentioned, an anomalous plasma event may bring about damage to a wafer undergoing a fabrication process, and/or may bring about damage to fabrication chamber 165. In other instances, an anomalous plasma event may bring about the creation of gaseous compounds within the fabrication chamber, which may have a detrimental effect on an ongoing fabrication process.

Figure 2A:
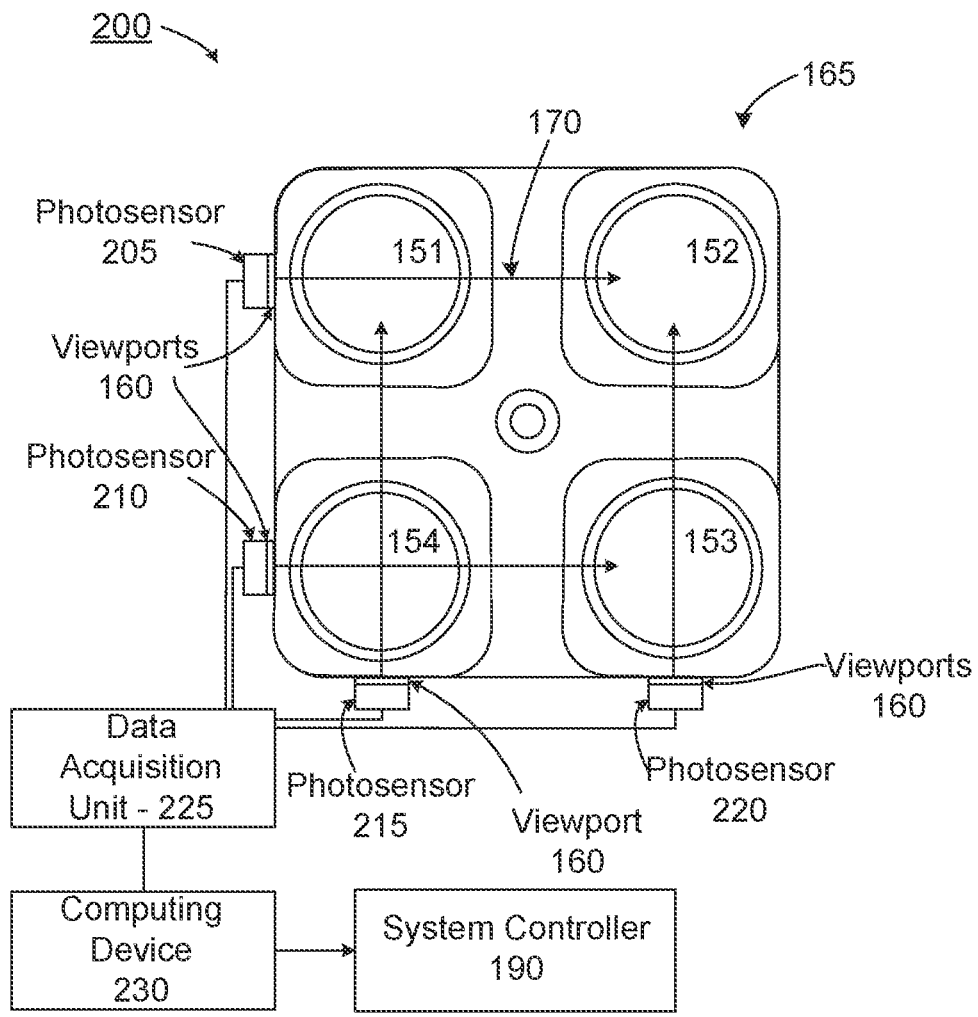
FIG. 2A is a schematic view of an example anomalous plasma event detection and location system implemented on a multi-station integrated circuit fabrication chamber, according to an embodiment.

FIG. 2A is a schematic view of an example anomalous plasma event detection and location system implemented on a multi-station integrated circuit fabrication chamber, according to an embodiment 200. In FIG. 2A, photosensors 205, 210, 215, and 220 are shown as being proximate with one of viewports 160. In addition, photosensors 205, 210, 215, and 220 include a field of view that overlaps with a field of view of at least one other photosensor. Thus, photosensor 205 includes a field of view that overlaps (at least in part) with the field of view of photosensor 215 and photosensor 220. Accordingly, in one example, responsive to an anomalous plasma event occurring at or near process station 151, optical emissions generated during the event may be detected by photosensor 205 and photosensor 215. In another example, responsive to an anomalous event occurring at or near process station 152, optical emissions generated during the event may be detected by photosensor 205 and photosensor 220. Thus, in the embodiment of FIG. 2A, an anomalous plasma event occurring at any one of process stations 151, 152, 153, and 154 may be detected by 2 of photosensors 205, 210, 215, and 220. Additionally, evaluating output signals from photosensors 205, 210, 215, and 220 may permit the unique identification of a process station, of the multi-station integrated circuit fabrication chamber, at (or nearby) which an anomalous plasma event has occurred. With this in mind, this disclosure may apply to any multi-station reactor in which one or more photosensors maintains a line of sight through multiple stations, and two or more of the photosensors maintain intersecting lines of sight, where the intersections occur in particular stations. By considering readings from multiple PSs having intersecting lines of sight, the system can uniquely identify stations where a detectable anomalous event occurred.

Figure 2B:
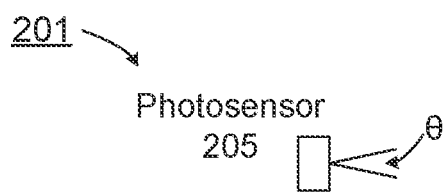
FIG. 2B shows an example photosensor having a field of view suitable to detect an anomalous plasma event occurring within a multi-station integrated circuit fabrication chamber, according to an embodiment.

As shown in FIG. 2B (embodiment 201) a photosensor may be shaped or configured to receive signals from a limited range an azimuth and elevation. As shown in FIG. 2B, photosensor 205, for example, may include a field of view depicted as an angle "θ," which may extend in both elevation and azimuth. In this context, angle "θ" refers to a field of view that encompasses, at least a substantial portion of a proximate process station as well as a distal process station along a radial line that extends in a direction normal to a photosensor. Thus, returning to FIG. 2A, photosensor 205 includes a field of view that encompasses at least a substantial portion of process station 151 (proximal) and process station 152 (distal), both of which are arranged along radial line 170. In a specific and nonlimiting example, photosensors 205, 210, 215, and 220 may correspond to a silicon-based switchable gain detector, which may provide detection of an optical signal comprising a wavelength of between about 300 nm to about 1100 nm, available from Thorlabs Inc., 56 Sparta Avenue, Newton, N.J. 07860. However, claimed subject matter is intended to embrace a variety of photosensors capable of generating electrical signal responsive to detection of optical omissions at infrared, visible, and/or ultraviolet wavelengths.

As mentioned previously with respect to the description of FIG. 2A, photosensor 205, for example, may include a field of view to exclusively detect anomalous plasma events occurring at or nearby process stations 151 and 152. Thus, when an anomalous plasma event occurs at or near process station 154 and/or process station 153, optical emissions generated in response to the anomalous plasma event may remain undetected by photosensor 205. Responsive to an anomalous plasma event occurring at or nearby process stations 151 or 152, for example, photosensor 205 may receive a momentary burst of optical emissions, such as in the form of visible light having a wavelength of between about 300 nm and about 700 nm. However, in other embodiments, anomalous plasma events may bring about a momentary burst of optical emissions comprising other wavelengths, such as ultraviolet wavelengths of less than about 300 nm (e.g., 100 nm, 200 nm, 250 nm, etc.) and/or infrared wavelengths of greater than about 700 nm (e.g., 750 nm, 800 nm, 900 nm, etc.)

Photosensor 210 may include a field of view similar to that of photosensor 205. Thus, in the embodiment of FIG. 2A, an anomalous plasma event occurring at or near process station 154 or process station 153 may bring about a momentary burst of optical emissions, which may be received by photosensor 210. Further, when an anomalous plasma event occurs at or near process station 151 or process station 152, optical emissions generated in response to the anomalous plasma event may remain undetected by photosensor 210.

Photosensor 215 may include a field of view similar to that of photosensors 205 and 210. Thus, an anomalous plasma event occurring at or near process station 154 or process station 151 may bring about a momentary burst of optical emissions, which may be received by photosensor 215. Further, when an anomalous plasma event occurs at or near process station 152 or process station 153, optical emissions generated in response to the anomalous plasma event may remain undetected by photosensor 215.

Photosensor 220 may include a field of view similar to that of photosensors 205, 210, and 215. Thus, an anomalous plasma event occurring at or near process station 152 or process station 153 may bring about a momentary burst of optical emissions, which may be received by photosensor 220. Further, when an anomalous event occurs at or near process station 151 or process station 153, optical emissions generated in response to the anomalous plasma event may remain undetected by photosensor 220.

Accordingly, it may be appreciated that photosensors 205, 210, 215, and 220 may each include a field of view that encompasses particular process stations of integrated circuit fabrication chamber 165 while excluding other process stations of fabrication chamber 165. Hence, in particular embodiments, monitoring output signal traces from each of photosensors 205, 210, 215, and 220 may permit identification of a process station at which an anomalous plasma event has occurred. Accordingly, in an example, which will be discussed in relation to FIG. 2C, output signal traces from photosensors 210 and 215 attaining a signal level that corresponds to a logic "high," can be utilized to identify process station 154 as being at or nearby an anomalous plasma event.

Output signal traces from photosensors 205, 210, 215, and 220 may exhibit an amplitude proportional, such as linearly proportional, to the intensity of the optical emissions received by the photosensors. Thus, in particular embodiments, a relatively high amplitude burst of optical emissions received by photosensor 205, for example, may bring about a proportionally high signal at an output port of photosensor 205. Likewise, a relatively low amplitude burst of optical emissions received by photosensor 205, for example, may bring about a proportionally low signal at an output port of photosensor 205. Additionally, an increase or decrease in the amplitude of an output signal present at an output port of photosensor 205, for example, may track or closely follow exposure of photosensor 205 to an optical signal.

In the embodiment of FIG. 2A, data acquisition unit 225 may receive output signal traces from photosensors 205, 210, 215, and 220. In response to receipt of one or more output signal traces, data acquisition unit 225 may provide a signal to computing device 230 to indicate that an anomalous plasma event has occurred. In addition, data acquisition unit 225 may operate to filter out or screen signal traces that do not meet particular predetermined criteria. For example, in certain embodiments, an anomalous plasma event having a particular duration, such as a duration of between about 1 μs and about 100 ms, may be likely to bring about damage to a semiconductor wafer being fabricated. An anomalous plasma event having a duration of between about 1 μs and 100 μs may bring about damage to an integrated circuit fabrication chamber. In contrast, an anomalous plasma event having a duration outside of a particular duration (such as a duration less than about 1 μs) may be unlikely to bring about damage to a semiconductor wafer being fabricated via to an integrated circuit fabrication chamber. Thus, in response to data acquisition unit 225 receiving a signal from one or more of photosensors 205, 210, 215, and 220 having a duration that lies outside of a particular duration may be regarded as being inconsequential. In particular embodiments, data acquisition unit 225 may correspond to a model 779676-01 Multifunction Input/Output Module available from National Instruments located at 11500 N Mopac Expressway, Austin Tex. 78759-3504. In a specific, nonlimiting example, computing device 230 may execute computer-readable instructions stored via a non-transitory media, such as SignalExpress software for logging, analyzing, and presenting data from measurement devices also available from National Instruments of Austin Tex. However, claimed subject matter is intended to embrace a variety of data acquisition units/ modules capable of receiving signals from one or more photosensors, processing the received signals, and transmitting the results of such signal processing to a computing device, such as computing device 230.

Accordingly, for example, responsive to data acquisition unit 225 receiving relatively high output signals from photosensors 205 and 215 and having a duration of about 10 ms, data acquisition unit 225 may report an indication to computing device 230 that signals meeting a predetermined amplitude and duration criteria have been received. In response, computing device 230 may provide an indication to system controller 190 that an anomalous plasma event has occurred at or near processing station 151. In response, system controller 190 may provide an indication that a semiconductor wafer undergoing processing at process station 151 should undergo a metrology process, which may include performing electrical measurements, physical inspections, and/or other processes. In contrast, in response to data acquisition unit 225 receiving relatively high output signals from photosensors 205 and 215 having a duration of about 0.9 μs (or any other duration less than about 1 μs), data acquisition unit 225 may provide no report to computing device 230. Alternatively, under such conditions, data acquisition unit 225 may report occurrence of an anomalous plasma event, but may label such an event as inconsequential. Hence, computing device 230 may report occurrence of the inconsequential event to system controller 190, or (alternatively) may refrain transmitting any type of report to system controller 190.

Responsive to detection of anomalous plasma events occurring over a duration greater than about 100 ms, system controller 190 may operate to adjust or suspend an output power level of one or more RF signals generated by RF power generator 195. Thus, in one example, system controller 190 may adjust a LF component generated by RF power generator 195 (e.g., a frequency of less than about 2 MHz) or may adjust a HF component generated by RF power generator 195 (e.g., a frequency of greater than about 2 MHz). Adjustment of output power of RF power generator 195 may involve reducing power levels of both LF and HF components generated by RF power generator 195. In another example, responsive to detection of anomalous plasma events, system controller 190 may operate to modify a duty cycle of RF power generator 195. Thus, in an example, in response to detection of an anomalous plasma event, system controller 190 may modify the duty cycle of an RF power generator, such as by reducing the duty cycle from about 100% to about 95%. It should be noted that claimed subject matter is intended to embrace system controllers that perform other types of modifications to RF power generator 195, and claimed subject matter is not limited in this respect.

Figures 2C, 2D:
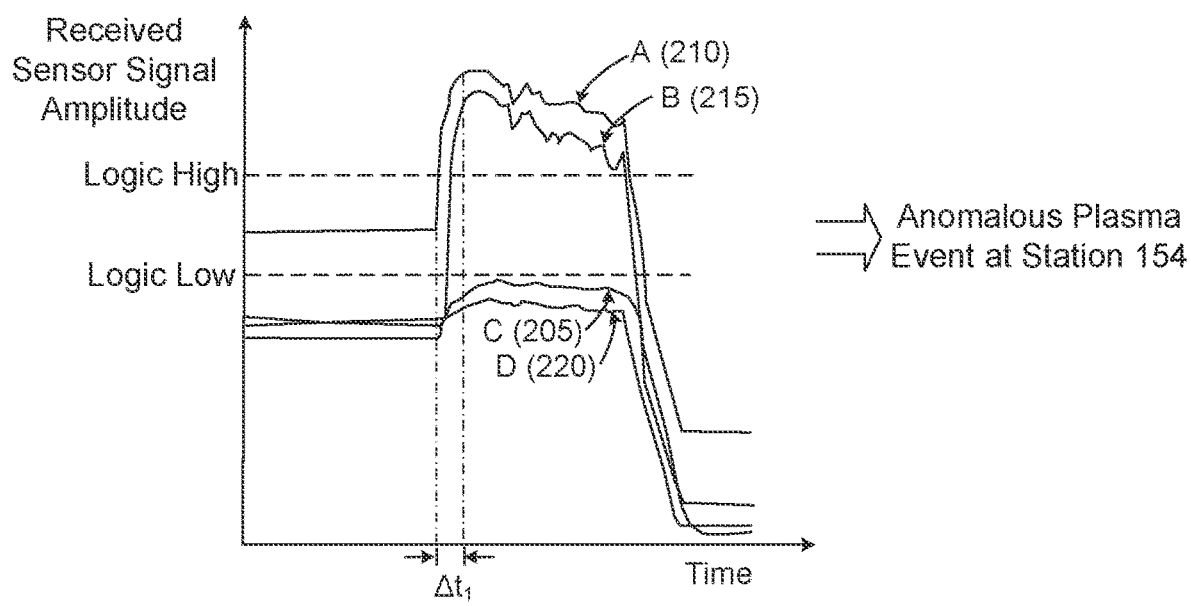
FIG. 2C is an example truth table showing logic states corresponding to output signals of photosensors implemented in an anomalous plasma event detection and location system of a multi-station integrated circuit fabrication chamber, according to an embodiment.
FIG. 2D is an example output signal trace from photosensors indicating an anomalous plasma event in a multi-station integrated circuit fabrication chamber, according to an embodiment.

FIG. 2C is an example truth table showing logic states corresponding to output signals of photosensors implemented in an anomalous plasma event detection and location system of a multi-station integrated circuit fabrication chamber, according to an embodiment 202. The truth table of FIG. 2C establish is a correspondence between an output signal of each of the plurality of photosensors (205, 210, 215, and 220) with each station of the multi-station integrated circuit fabrication chamber 165. Thus, in the embodiment of FIG. 2C, a relatively high-level output signal from photosensors 205-220 of FIG. 2A corresponds to a logic "high" signal, while a relatively low-level output signal from photosensors 205-220 corresponds to a logic "low" signal. Such correspondence between photosensor logic states and photosensor output signals may involve one or more comparator circuits within data acquisition unit 225, in which a signal of a magnitude greater than a particular threshold is assigned a logic "high." Similarly, a signal of a magnitude less than a particular threshold is assigned a logic "low." Thus, referring to the schematic view of FIG. 2A, responsive to detection of an anomalous plasma event at or nearby process station 151, output signals from photosensors 205 and 215 include relatively high levels corresponding to a logic "high." Accordingly, referring to FIG. 2C, in one example responsive to output signals of photosensors 205 and 215 corresponding to logic "high" and output signals of photosensors 210 and 220 corresponding to logic "low," data acquisition unit 225 can correctly determine that an anomalous plasma event has occurred at or near process station 151. In another example, responsive to output signals of photosensors 210 and 220 corresponding to logic "high" and output signals of photosensors 205 and 215 corresponding to logic "low," data acquisition unit 225 can correctly determine that an anomalous plasma event has occurred at or near process station 153.

It should be noted that the photosensor arrangement of FIG. 2A, in which photosensors 205, 210, 215, and 220 are positioned at adjacent sides or edges of multi-station integrated circuit fabrication chamber 165 corresponds to the truth table of FIG. 2C. However, alternative arrangements of photosensors 205, 210, 215, and 220 may correspond to truth tables different than that of FIG. 2C, as will be and described in relation to FIG. 3. Claimed subject matter is intended to embrace any arrangement of photosensors positioned at sides or edges of an integrated circuit fabrication chamber as well as truth tables created to show logic states corresponding to a desired arrangement of photosensors.

FIG. 2D is an example output signal trace from photosensors indicating an anomalous plasma event in a multi-station integrated circuit fabrication chamber, according to an embodiment 203. As shown in FIG. 2D, signal trace A, which corresponds to an output signal trace from photosensor 210 of FIG. 2A, and signal trace B, which corresponds to an output signal trace from photosensor 215 of FIG. 2A, are indicated as comprising an amplitude greater than a logic high. Conversely, signal trace C, which corresponds to an output signal trace from photosensor 205, and signal trace D, which corresponds to an output signal trace from photosensor 220, are indicated as comprising an amplitude less than a logic low. Accordingly, responsive to receipt of such logic signal levels, the truth table of FIG. 2C indicates an anomalous plasma event at station 154.

It should be noted that photosensors 205, 210, 215, and 220 include a field of view that encompasses at least a substantial portion of a proximate process station as well as a distal process station along a radial line, such as radial line 170 of FIG. 2A. However, reflections within a multi-station integrated circuit fabrication chamber may give rise to small, sub-threshold responses in other photosensors. For example, as shown in FIG. 2D, an anomalous plasma event at or near process station 154 gives rise to signals corresponding to a logic "high" at output terminals of photosensors 210 and 215. In addition, reflections within a fabrication chamber, or anomalous plasma events that may not precisely coincide with the location of process chamber 154, may bring about such sub-threshold signals. It may be appreciated that the logic high and logic low thresholds, such as shown in FIG. 2D, may be determined via some level of experimentation, which may depend upon compositions and/or concentrations of gases utilized in a multi-station integrated circuit fabrication chamber. Logic high and logic low thresholds may also depend on power and frequency content of an RF signal coupled to the fabrication chamber, reflected power from the fabrication chamber, and so forth, and claimed subject matter is not limited in this respect.

In addition, also as shown in FIG. 2D, anomalous plasma events may be characterized by comprising a particular rise time, At. In particular embodiments, an anomalous plasma event brings about a signal rise time, in which a signal trace advances from a magnitude corresponding to less than a logic low to a level greater than a logic high, in a period of time that ranges from about 1 us to about 100 ms. However, in certain embodiments, an anomalous plasma event may bring about a signal rise time of less than about 1 μs, such as about 0.9 μs, about 0.8 μs, about 0.7 μs, about 0.6 μs, etc., and claimed subject matter is not limited in this respect. In certain other embodiments, an anomalous plasma event may bring about a signal rise time of greater than about 100 ms, such as about 110 ms, about 120 ms, about 130 ms, etc., and claimed subject matter is not limited in this respect.

Figure 3:
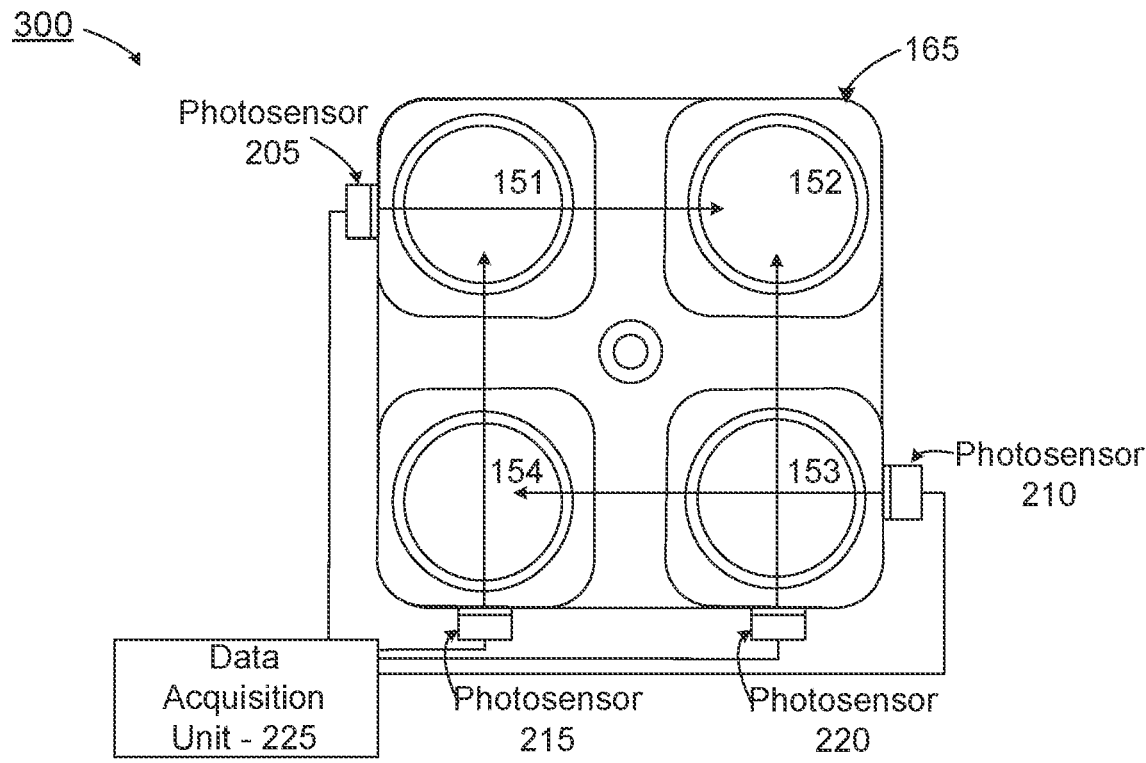
FIG. 3 is a schematic view of an example of an anomalous plasma event detection and location system implemented on a multi-station integrated circuit fabrication chamber, according to another embodiment.

FIG. 3 is a schematic view of an example of an anomalous plasma event detection and location system implemented on a multi-station integrated circuit fabrication chamber, according to another embodiment (300). As shown in FIG. 3, photosensor 205 includes a field of view that permits detection of anomalous plasma events occurring at or near process stations 151 and 152. Photosensor 210, includes a field of view that permits detection of anomalous plasma events at or near process stations 153 and 154. Photosensor 215 includes a field of view that permits detection of anomalous plasma events occurring at or near process stations 151 and 154. Photosensor 220 includes a field of view that permits detection of anomalous plasma events occurring at or near process stations 152 and 153. Thus, it may be appreciated that a truth table, such as a truth table similar to that of FIG. 2C, may be created to show logic states corresponding to output signals of photosensors implemented in accordance with FIG. 3.

Figure 4A:
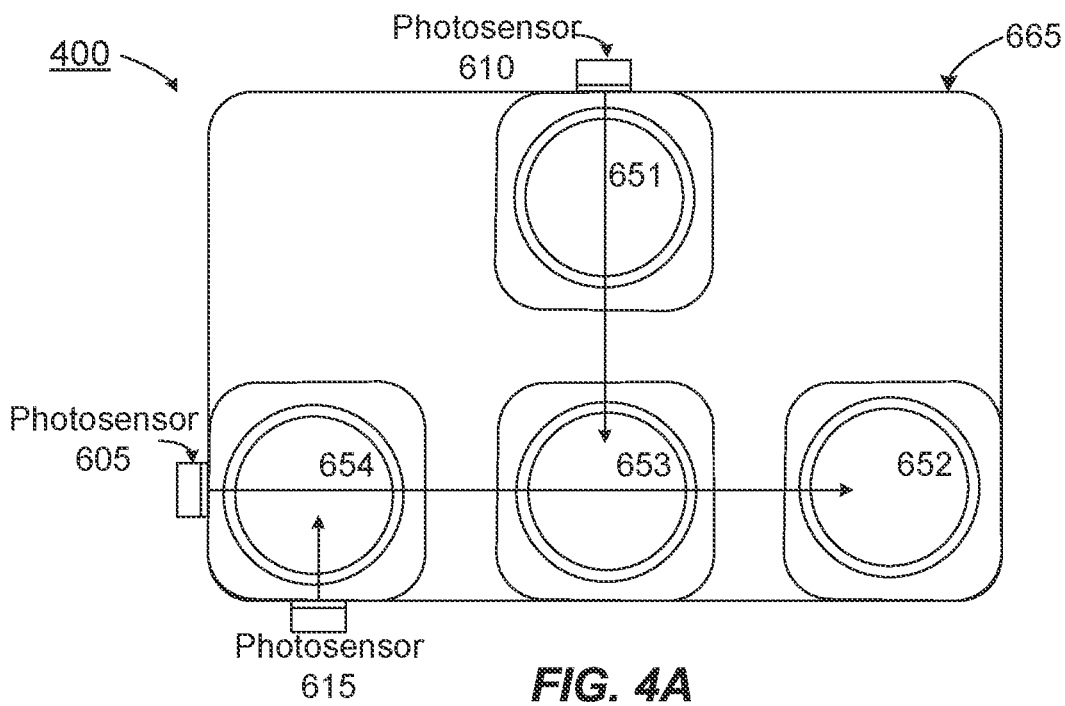
FIG. 4A is a schematic view of an example of an anomalous plasma event detection and location system implemented on a multi-station integrated circuit fabrication chamber, according to another embodiment.

FIG. 4A is a schematic view of an example of an anomalous plasma event detection and location system implemented on a multi-station integrated circuit fabrication chamber, according to another embodiment (400). In the embodiment of FIG. 4, process stations 651, 652, 653, and 654 are positioned within multi-station integrated circuit fabrication chamber 665. Although not shown in FIG. 4A, a controller, RF power generator, computing device, and a data acquisition unit may be connected to fabrication chamber 665 in a manner similar to the connections made to fabrication chamber 165 of FIG. 2A. Thus, multi-station integrated circuit fabrication chamber 665 may be capable of performing film deposition/film etching processes similar to those of fabrication chamber 165.

In the embodiment of FIG. 4A, photosensor 605 may be positioned near a viewport so as to permit optical emissions resulting from anomalous plasma events occurring at or near process stations 652, 653, and 654 to be received by photosensor 605. However, the field of view of photosensor 605 may be sufficiently narrow so as to exclude receipt of significant optical emissions radiating from locations at or near process station 651. Similarly, photosensor 610 may be positioned near a viewport so as to permit optical emissions resulting from anomalous plasma events occurring at or near process stations 651 and 653 to be received by photosensor 610. However, the field of view of photosensor 610 may be sufficiently narrow so as to exclude receipt of significant optical emissions radiating from locations at or near process stations 652 and 654. Similarly, photosensor 615 may be positioned near a viewport so as to permit optical emissions radiating from anomalous plasma events occurring at or near process station 654 to be received by photosensor 615. However, the field of view of photosensor 615 may be sufficiently narrow so as to exclude receipt of significant optical emissions radiating from locations at or near process stations 651, 652, and 653.

Thus, the arrangement of process stations within multi-station integrated circuit fabrication chamber 665 permits anomalous plasma event detection and location utilizing 3 photosensors (605, 610, and 615) rather than 4 photosensors (205, 210, 215, and 220, discussed in relation to FIGS. 2A and 3A. FIG. 4B is an example showing logic states corresponding to output signals of photosensors implemented in the example anomalous plasma event detection and location system of FIG. 4A, according to another embodiment (401). In the embodiment of FIG. 4B, for example, a relatively high-level output signal from photosensor 610 and a relatively low-level signal from photosensors 605 and 615 indicate presence of an anomalous plasma event at or near process station 651. In another example relating to FIG. 4B, a relatively high-level signal from photosensor 605 and a relatively low-level signal from photosensors 610 and 615 indicate presence of an anomalous plasma event at or near process station 652. In another example relating to FIG. 4B, a relatively high-level signal from photosensors 605 and 610 and a relatively low-level signal from photosensor 615 indicates presence of an anomalous plasma event at or near process station 653. In another example relating to FIG. 4B, a relatively high-level signal from photosensors 605 and 615 and a relatively low-level signal from photosensor 610 indicates presence of an anomalous plasma event at or near process station 654.

FIG. 5 is a flowchart for an example method of anomalous plasma event detection and location implemented on a multi-station integrated circuit fabrication chamber, according to an embodiment (500). It should be noted that claimed subject matter is intended to embrace variations of FIG. 5, including methods that include actions in addition to those of FIG. 5, actions performed in an order different than those of FIG. 5, as well as methods including fewer steps than those shown in FIG. 5. In addition, although the apparatuses of FIGS. 2A, 3, and 4A may be suitable for performing the method of FIG. 5, the method may be performed by other apparatuses, systems, or arrangements, and claimed subject matter is not limited in this respect. The method of FIG. 5 may begin at 510, which may include receiving output signals from a plurality of photosensors, each photosensor having a field of view of 2 or more stations of a multi-station integrated circuit fabrication chamber. In particular embodiments, the field of view of at least one photosensor of the plurality of photosensors overlaps with the field of view of at least 1 other photosensor of the plurality of photosensors.

The method of FIG. 5 may continue at 520, which includes filtering the received output signals to screen output signals having less than a threshold amplitude. At 520, filtering may include screening signals having a duration less than a threshold, such as a threshold of about 1 μs. The method may continue at 530, which may include comparing logic states corresponding to the filtered received output signals to identify the station of the multi-station integrated circuit fabrication chamber at which an anomalous plasma event has occurred.

Referring back to FIG. 1B, system controller 190 may include a portion of a system, which may form a part of the apparatus of FIGS. 1A/1B. Such systems can include semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the number of cycles performed on a substrate, the delivery of processing gases, temperature settings (e.g., heating and/or cooling), pressure settings, vacuum settings, power settings, radio frequency RF generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers or field-programmable gate arrays (FPGA) or FPGA with system-on-a-chip (SoC) that that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus, as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

In the foregoing detailed description, numerous specific details are set forth to provide a thorough understanding of the presented embodiments or implementations. The disclosed embodiments or implementations may be practiced without some or all of these specific details. In other instances, well-known process operations have not been described in detail so as to not unnecessarily obscure the disclosed embodiments or implementations. While the disclosed embodiments or implementations are described in conjunction with the specific embodiments or implementations, it will be understood that such description is not intended to limit the disclosed embodiments or implementations.

The foregoing detailed description is directed to certain embodiments or implementations for the purposes of describing the disclosed aspects. However, the teachings herein can be applied and implemented in a multitude of different ways. In the foregoing detailed description, references are made to the accompanying drawings. Although the disclosed embodiments or implementation are described in sufficient detail to enable one skilled in the art to practice the embodiments or implementation, it is to be understood that these examples are not limiting; other embodiments or implementation may be used and changes may be made to the disclosed embodiments or implementation without departing from their spirit and scope. Additionally, it should be understood that the conjunction "or" is intended herein in the inclusive sense where appropriate unless otherwise indicated; for example, the phrase "A, B, or C" is intended to include the possibilities of "A," "B," "C," "A and B," "B and C," "A and C," and "A, B, and C."

In this application, the terms "semiconductor wafer," "wafer," "substrate," "wafer substrate," and "partially fabricated integrated circuit" are used interchangeably. One of ordinary skill in the art would understand that the term "partially fabricated integrated circuit" can refer to a silicon wafer during any of many stages of integrated circuit fabrication thereon. A wafer or substrate used in the semiconductor device industry may include a diameter of 200 mm, or 300 mm, or 450 mm. The foregoing detailed description assumes embodiments or implementations are implemented on a wafer, or in connection with processes associated with forming or fabricating a wafer. However, the claimed subject matter is not so limited. The work piece may be of various shapes, sizes, and materials. In addition to semiconductor wafers, other work pieces that may take advantage of claimed subject matter may include various articles such as printed circuit boards, or the fabrication of printed circuit boards, and the like.

Unless the context of this disclosure clearly requires otherwise, throughout the description and the claims, the words "comprise," "comprising," and the like are to be construed in an inclusive sense as opposed to an exclusive or exhaustive sense; that is to say, in a sense of "including, but not limited to." Words using the singular or plural number also generally include the plural or singular number respectively. When the word "or" is used in reference to a list of 2 or more items, that word covers all of the following interpretations of the word: any of the items in the list, all of the items in the list, and any combination of the items in the list. The term "implementation" refers to implementations of techniques and methods described herein, as well as to physical objects that embody the structures and/or incorporate the techniques and/or methods described herein.

What is claimed is:

1. A fabrication chamber, comprising:
a plurality of stations;
a plurality of viewports at least partially transparent to optical emissions that emanate from at least one station of the plurality of stations;
a plurality of photosensors, each sensor of the plurality of photosensors arranged proximate to a corresponding one of the plurality of viewports, to detect the optical emissions that emanate from the at least one station of the plurality of stations; and
a processor configured to identify the at least one station of the plurality of stations at which an anomalous plasma event has occurred based, at least in part, on output signals from at least two photosensors of the plurality of photosensors, wherein:
a first viewport of the plurality of viewports permits visibility into first and second stations of the plurality of stations,
a second viewport of the plurality of viewports permits visibility into third and fourth stations of the plurality of stations, and
a third viewport of the plurality of viewports permits visibility into the first and the third stations of the plurality of stations.

2. The fabrication chamber of claim 1, wherein the plurality of viewports are arranged in adjacent sidewalls of the fabrication chamber to permit transmission of the optical emissions from each of the plurality of stations.

3. The fabrication chamber of claim 2, wherein the plurality of stations comprises 4 stations.

4. The fabrication chamber of claim 1, wherein one or more viewports of the plurality of viewports permits observation of two or more adjacent, but not all, stations.

5. The fabrication chamber of claim 1, wherein the processor identifies the at least one station of the plurality of stations at which the anomalous plasma event has occurred responsive to evaluation of the output signals from the plurality of photosensors.

6. The fabrication chamber of claim 1, wherein a fourth viewport of the plurality of viewports permits visibility into the second and the fourth stations of the plurality of stations.

7. The fabrication chamber of claim 1, wherein the viewports are at least partially transparent to the optical emissions with wavelengths of between about 300 nm and about 700 nm.

8. The fabrication chamber of claim 1, wherein the processor is configured to identify the at least one station at which the anomalous plasma event has occurred based, at least in part, on the anomalous plasma event that occurs over a duration of between about 1 us and about 100 ms.

9. The fabrication chamber of claim 1, wherein the anomalous plasma event comprises a transient generation of an electrical discharge between two or more localized regions within one of the plurality of stations.

10. The fabrication chamber of claim 9, wherein the processor is configured to identify the at least one station at which the anomalous plasma event has occurred based, at least in part, on the optical emissions that reach a threshold amplitude in less than about 100 ms.

11. The fabrication chamber of claim 10, wherein the processor generates a signal to indicate that a semiconductor wafer at the at least one station of the plurality of stations is proximate to a location at which the anomalous plasma event has occurred.

12. The fabrication chamber of claim 1, wherein the fabrication chamber is configured to perform a plasma-based etching process or a plasma-based deposition process.

13. An apparatus, comprising:
first, second, and third photosensors, each of the first, second, and third photosensors arranged at a corresponding viewport of a multi-station integrated circuit fabrication chamber, each of the first, second, and third photosensors configured to detect an optical signal with a minimum threshold amplitude within about 1 µs and about 100 ms; and
a processor configured to identify a station of the multi-station integrated circuit fabrication chamber which has undergone an anomalous plasma event based, at least in part, on output signal levels of each of the first and second photosensors, wherein:
a first viewport of the plurality of viewports has the first photosensor and permits visibility into first and second stations of the plurality of stations,
a second viewport of the plurality of viewports has the second photosensor and permits visibility into third and fourth stations of the plurality of stations, and
a third viewport of the plurality of viewports has the third photosensor and permits visibility into the first and the third stations of the plurality of stations.

14. The apparatus of claim 13, wherein the processor is configured to identify the station that has undergone the anomalous plasma event based on a truth table that establishes a correspondence between an output signal of each of the first and second photosensors with each station of the multi-station integrated circuit fabrication chamber.

15. The apparatus of claim 13, wherein the first and second photosensors are configured to be arranged at adjacent sides of the multi-station integrated circuit fabrication chamber.

16. The apparatus of claim 14, additionally comprising a fourth photosensor arranged to detect the anomalous plasma event in one of 4 stations of the multi-station integrated circuit fabrication chamber.

17. An integrated circuit fabrication chamber, comprising:
a plurality of integrated circuit fabrication stations;
one or more input ports for coupling a radio frequency (RF) signal to at least one of the plurality of integrated circuit fabrication stations;
a plurality of viewports at least partially transparent to optical emissions that emanate from at least one of the plurality of integrated circuit fabrication stations; and
at least first, second, and third photosensors, each of the at least first, second, and third photosensors arranged proximate to a corresponding one of the plurality of viewports, to detect the optical emissions that emanate from the at least one of the plurality of integrated circuit fabrication stations, wherein:
a first viewport of the plurality of viewports has the first photosensor and permits visibility into first and second stations of the plurality of stations,
a second viewport of the plurality of viewports has the second photosensor and permits visibility into third and fourth stations of the plurality of stations, and
a third viewport of the plurality of viewports has the third photosensor permits visibility into the first and the third stations of the plurality of stations.

18. The integrated circuit fabrication chamber of claim 17, wherein the plurality of viewports are at least partially transparent to the optical emissions with a wavelength of about 300 nm to about 700 nm.

19. The integrated circuit fabrication chamber of claim 17, wherein the optical emissions are generated responsive to the RF signal coupled to the at least one of the plurality of integrated circuit fabrication stations.

20. The integrated circuit fabrication chamber of claim 17, wherein the plurality of integrated circuit fabrication stations comprises 4 stations.

21. The integrated circuit fabrication chamber of claim 17, wherein the at least first and second photosensors provide an output signal in response to detection of the optical emissions with a duration of at least 1 µs.

22. The integrated circuit fabrication chamber of claim 21, wherein the at least first and second photosensors provide output signals to a processor to identify a station of the plurality integrated circuit fabrication stations at which an anomalous plasma event has occurred.

23. The integrated circuit fabrication chamber of claim 22, wherein the processor is to identify the station of the plurality of integrated circuit fabrication stations based, at least in part, on output signals from the first and second photosensors of the at least first and second photosensors.

24. The apparatus of claim 17, further comprising a fourth photosensor arranged proximate to a fourth viewport of the plurality of viewports to detect the optical emissions that emanate from the at least one of the plurality of integrated circuit fabrication stations, wherein the fourth viewport of the plurality of viewports permits visibility into the second and the fourth stations of the plurality of stations.

25. The apparatus of claim 16, wherein a fourth viewport of the plurality of viewports has the fourth photosensor and permits visibility into the second and the fourth stations of the plurality of stations.

* * * * *